US012650462B2

(12) United States Patent
Chan

(10) Patent No.: US 12,650,462 B2
(45) Date of Patent: Jun. 9, 2026

(54) DEVICE AND THERMAL TESTER FOR THERMAL TESTING DIES OF AN INTEGRATED CIRCUIT

(71) Applicant: AEM SINGAPORE PTE. LTD., Singapore (SG)

(72) Inventor: See Jean Chan, Singapore (SG)

(73) Assignee: AEM SINGAPORE PTE. LTD., Singapore (SG)

( * ) Notice: Subject to any disclaimer, the term of this patent is extended or adjusted under 35 U.S.C. 154(b) by 103 days.

(21) Appl. No.: 18/694,192

(22) PCT Filed: Sep. 21, 2022

(86) PCT No.: PCT/SG2022/050679
§ 371 (c)(1),
(2) Date: Mar. 21, 2024

(87) PCT Pub. No.: WO2023/048644
PCT Pub. Date: Mar. 30, 2023

(65) Prior Publication Data
US 2024/0385237 A1     Nov. 21, 2024

(30) Foreign Application Priority Data
Sep. 21, 2021   (SG) ........................... 10202110429W

(51) Int. Cl.
*G01R 31/28*       (2006.01)
*G01R 31/319*      (2006.01)
*G01R 31/327*      (2006.01)
(52) U.S. Cl.
CPC ..... *G01R 31/2875* (2013.01); *G01R 31/2877* (2013.01); *G01R 31/31905* (2013.01); *G01R 31/3274* (2013.01)

(58) Field of Classification Search
None
See application file for complete search history.

(56) References Cited

U.S. PATENT DOCUMENTS 11,378,615 B2 *   7/2022   Chan ...................... H10N 10/13
11,454,666 B2 *   9/2022   Chan ................... G01R 1/0416
(Continued)

FOREIGN PATENT DOCUMENTS

EP        1196790 B1     5/2004

OTHER PUBLICATIONS

International Search Report for Application No. PCT/SG2022/050769, dated Apr. 13, 2023, 4 pages.
(Continued)

*Primary Examiner* — Jermele M Hollington
(74) *Attorney, Agent, or Firm* — Baker Donelson; Carl M. Davis, II

(57)        ABSTRACT

A device for thermal testing one or more exposed or covered dies of an integrated circuit and a thermal tester for testing one or more exposed or covered dies of an integrated circuit on a testing platform are provided. The device for thermal testing the one or more exposed or covered dies of the integrated circuit includes a pedestal and a heatlet attached to a first end of the pedestal. The heatlet includes a face comprising one or more plates. The one or more plates are configured to match a geometry of the one or more dies. The heatlet also includes heating circuitry configured in operation to heat the one or more plates of the face and sensing circuitry configured in operation to sense a temperature of the heatlet.

23 Claims, 7 Drawing Sheets

100

DUT with expose die

(56) References Cited

U.S. PATENT DOCUMENTS

| | | | |
|---|---|---|---|
| 2002/0118032 | A1 | 8/2002 | Norris et al. |
| 2005/0007136 | A1 | 1/2005 | Feder et al. |
| 2019/0029076 | A1 | 1/2019 | Wallinger |
| 2020/0060019 | A1 | 2/2020 | Tustaniwskyj et al. |
| 2021/0325453 | A1* | 10/2021 | Chan .................. G01R 31/2874 |
| 2023/0296667 | A1* | 9/2023 | Ranganathan ..... G01R 31/2874 |
| | | | 700/299 |

OTHER PUBLICATIONS

Written Opinion for Application No. PCT/SG2022/050769, dated Apr. 13, 2023, 7 pages.

* cited by examiner

100

DUT with expose die

Lidded DUT

Prior Art

200

Cold Plate

208

204

114

Cold Plate

100

104

106

114

Prior Art

300

Prior Art

400

302

Cold Plate

Cartridge Heaters

204

114

302

Cold Plate

100

104

106

114

500

600

DEVICE AND THERMAL TESTER FOR THERMAL TESTING DIES OF AN INTEGRATED CIRCUIT

PRIORITY CLAIM

This application claims priority from Singapore Patent Application No. 10202110429W filed on 21 Sep. 2021.

TECHNICAL FIELD

The present invention generally relates to semiconductor die testing, and more particularly relates to systems and devices for semiconductor die thermal testing.

BACKGROUND OF THE DISCLOSURE

Backend semiconductor fabrication includes thermal testing a semiconductor die to assure that a resultant integrated circuit including the die can operate within thermal parameters for which it is designed.

Typical equipment for backend semiconductor thermal testing is expensive. There are numerous different semiconductor die profiles requiring a multitude of different testing platforms. In addition, each profile may have numerous different thermal parameter requirements based on the die and application(s) of the resultant integrated circuit.

Accordingly, a thermal testing device and system is needed which meets the requirements of the different die profiles and enables different thermal testing of such die while overcoming drawbacks of the prior art testing equipment in order to provide a simple, inexpensive and comprehensive solution.

SUMMARY

According to a first aspect, there is provided a device for thermal testing one or more exposed or covered dies of an integrated circuit, comprising: a pedestal; and a heatlet attached to a first end of the pedestal, the heatlet comprising: a face comprising one or more plates, wherein the one or more plates are configured to match a geometry of the one or more dies; heating circuitry configured in operation to heat the one or more plates of the face; and sensing circuitry configured in operation to sense a temperature of the heatlet.

According to a second aspect, there is provided a thermal tester for testing one or more exposed or covered dies of an integrated circuit on a testing platform, comprising: an adapter configured to match a geometry of the testing platform; a heatlet attached to a first end of the adapter, the heatlet comprising: a face comprising one or more plates, wherein the one or more plates are configured to match a geometry of the one or more dies; heating circuitry configured in operation to heat the one or more plates of the face; and sensing circuitry configured in operation to sense a temperature of the heatlet.

BRIEF DESCRIPTION OF THE DRAWINGS

Embodiments and implementations are provided by way of example only, and will be better understood and readily apparent to one of ordinary skill in the art from the following written description, read in conjunction with the drawings, in which:

FIG. 1, comprising

Figure 1A:
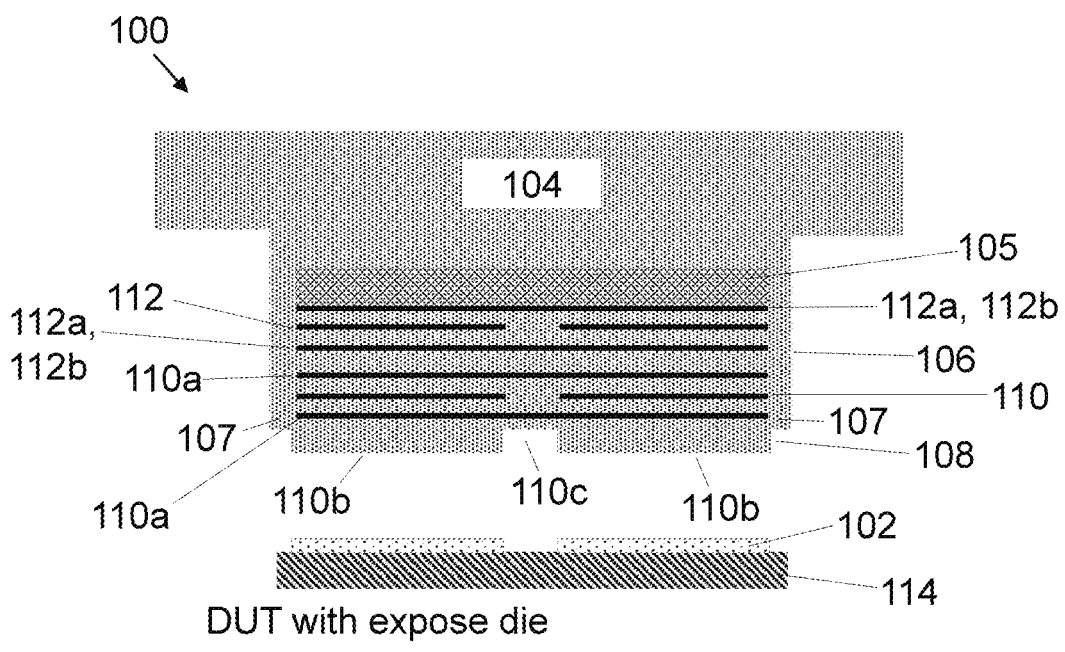
FIG. 1A and FIG. 1B, is a schematic representation of a device for thermal testing one or more exposed or covered dies of an integrated circuit, according to an example embodiment.

Skilled artisans will appreciate that elements in the figures are illustrated for simplicity and clarity and have not necessarily been depicted to scale.

DETAILED DESCRIPTION

Embodiments will be described, by way of example only, with reference to the drawings. Like reference numerals and characters in the drawings refer to like elements or equivalents.

As mentioned above, backend semiconductor fabrication includes thermal testing a semiconductor die to assure that a resultant integrated circuit including the die can operate within thermal parameters for which it is designed.

The present embodiments present a plug-and-play pedestal with a device called a heatlet for use in various semiconductor thermal testing equipment which can be configured for multiple die profiles and multiple thermal test patterns. The heatlet can be attached to the pedestal and can be wired to heat up and provide a thermal interface for a die under test (DUT).

The embodiments described in the present specification produce one or more technical effects. Advantageously, energy savings and time savings are achieved when thermal testing the DUT. In particular, when thermal testing the DUT, heating the DUT by heating the heatlet involves less power and time during a die temperature ramp up process than heating the whole pedestal by one or more cartridge heaters as only the heatlet needs to be heated and not the whole pedestal. Similarly, less power and time are involved when cooling the DUT during a die temperature ramp down process.

Figure 1B:
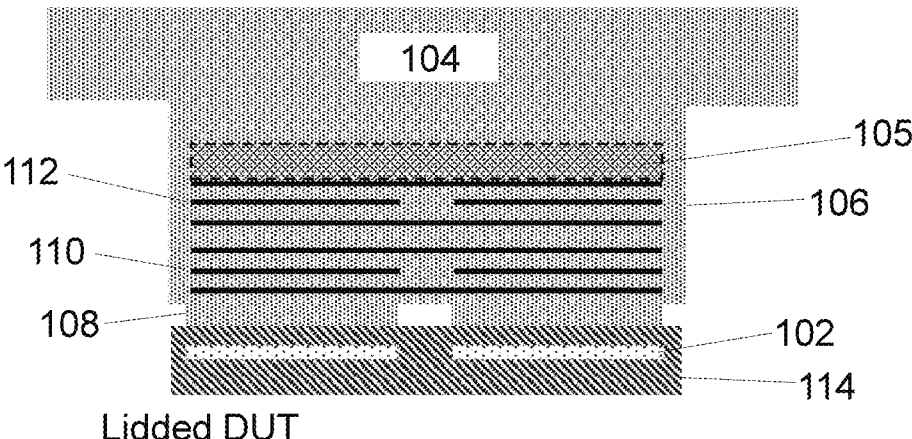

FIG. 1, comprising FIG. 1A and FIG. 1B, is a schematic representation of a device 100 for thermal testing one or more exposed or covered dies 102 of an integrated circuit, according to an example embodiment. The device 100 comprises a pedestal 104. The device 100 further comprises a heatlet 106 attached to a first end of the pedestal 104. The heatlet 106 comprises a face comprising one or more plates 108. The one or more plates 108 are configured to match a geometry of the one or more dies 102. The heatlet 106 also comprises heating circuitry 110 configured in operation to heat the one or more plates 108 of the face. Further, the heatlet 106 comprises sensing circuitry 112 configured in operation to sense a temperature of the heatlet 106. In accordance with the present embodiments, the heatlet 106 may comprise a ceramic heatlet.

As shown in FIG. 1, the heatlet 106 can have features (i.e., the one or more plates 108) on the surface (i.e., the face) where the heatlet 106 is in contact with the device under test (DUT) 114 when thermal testing the DUT 114. The one or more plates 108 can match the layout of the one or more dies 102 of the DUT 114 for temperature sensing and temperature control of a targeted area on the DUT 114. The heating circuitry 110 may comprise one or more layers of heating circuits 110*a* and the sensing circuitry 112 may comprise one or more layers of sensing circuits 112*a*.

In accordance with the present embodiments, at least one of the one or more layers of heating circuits 110*a* may comprise a plurality of individually controllable heating zones 110*b*. One or more of the plurality of individually controllable heating zones 110*b* can be configured to control a temperature in a corresponding one of the one or more plates 108 of the face. The device 100 may further comprise one or more grooves 110*c* disposed between the one or more plates 108 of the face and may also comprise grooves 110*c* disposed between the plurality of individually controllable heating zones 110*b*. At least one of the one or more layers of sensing circuits 112*a* may comprise a plurality of temperature sensors 112*b*, each of the plurality of temperature sensors 112*b* corresponding to one of the plurality of individually controllable heating zones 110*b*. The heating circuitry 110 and the sensing circuitry 112 can trace across the heatlet 106 with a specific pattern to cover an area or zone of interest. And, in accordance with the present embodiments, different configurations can have the heating circuitry 110 and the sensing circuitry 112 designed differently.

The one or more plates 108 on the face of the heatlet 106 can also be designed to have the temperature sensing and temperature control targeting specific zones or specific components under a lid of a lidded DUT 114.

Figure 2A:
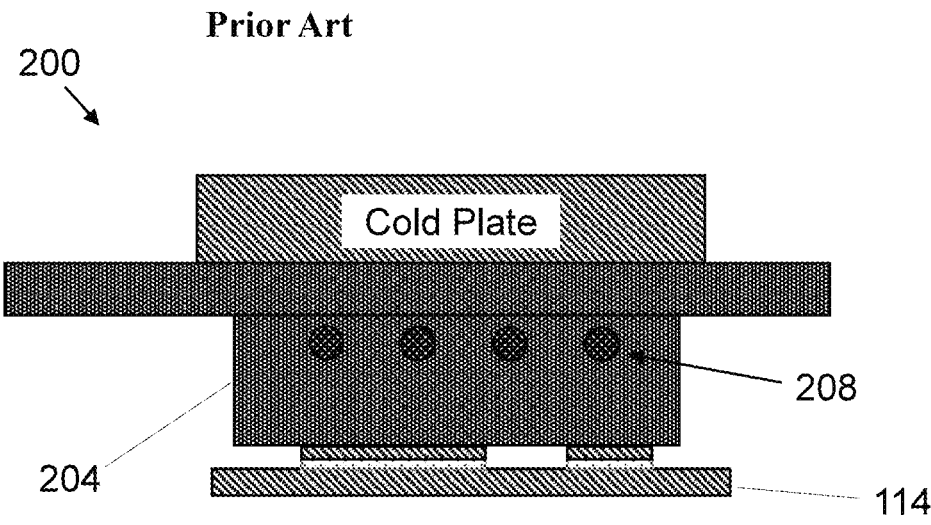
FIG. 2A is a schematic representation illustrating a typical device for thermal testing a die during a die temperature ramp up process.

FIG. 2A is a schematic representation 200 illustrating a typical device for thermal testing a die during a die temperature ramp up process. As shown in FIG. 2A, when thermal testing the DUT 114, the whole pedestal 204 may have to be heated up in order to heat up the DUT 114.

Figure 2B:
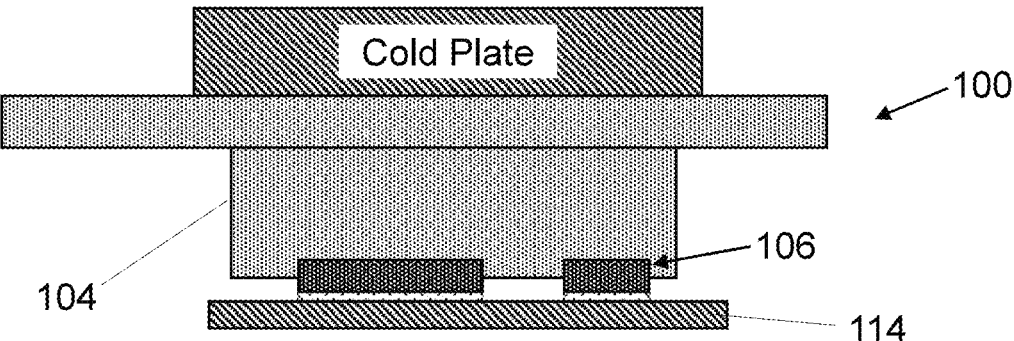
FIG. 2B is a schematic representation illustrating the device of FIG. 1 during the die temperature ramp up process.

FIG. 2B is a schematic representation 200 illustrating the device 100 of FIG. 1 during the die temperature ramp up process. As shown in FIG. 2B, when thermal testing the DUT 114, the heatlet 106 may be the only mass that is required to be heated up other than the DUT 114.

The advantageous effect is that when thermal testing the DUT 114, heating the DUT 114 by heating the heatlet 106 involves less power during the die temperature ramp up process than heating the whole pedestal 204 by the cartridge heaters 208 as the heatlet 106 may be the only mass that needs to be heated and not the whole pedestal 104.

Figure 3A:
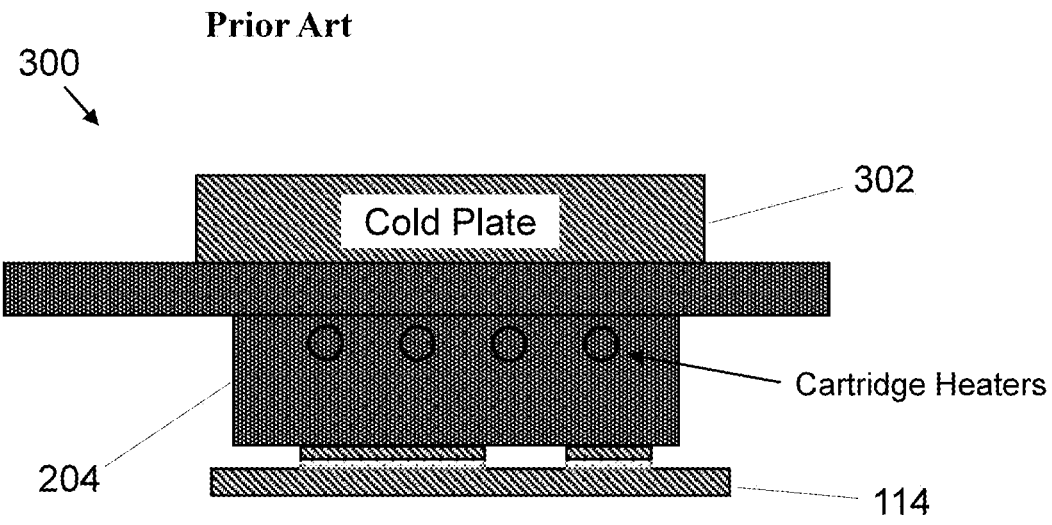
FIG. 3A is a schematic representation illustrating the typical device when a die temperature is maintained.

The heatlet also provides advantageous technical effects during a die temperature ramp down process (i.e., cooling process). FIG. 3A is a schematic representation 300 illustrating the typical device when a die temperature is maintained. As shown in FIG. 3A, the pedestal 204 may be maintained at a high temperature until the thermal testing requires a set temperature to change (i.e., a reduction in temperature).

Figure 3B:
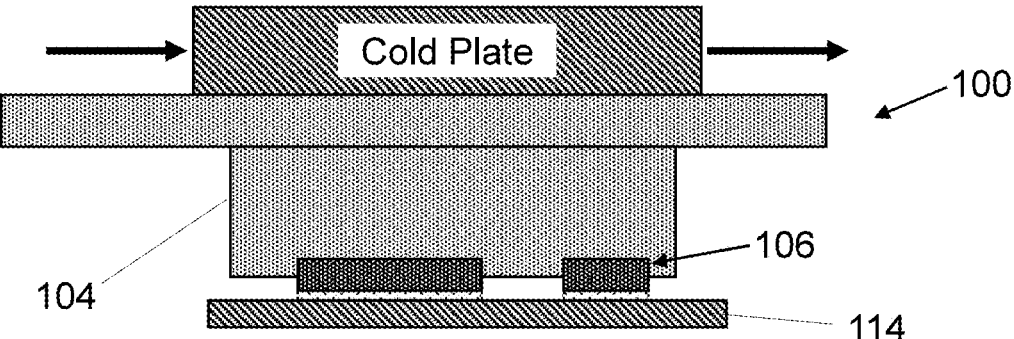
FIG. 3B is a schematic representation illustrating the device of FIG. 1 when the die temperature is maintained.

FIG. 3B is a schematic representation 300 illustrating the device 100 of FIG. 1 when the die temperature is maintained. As shown in FIG. 3B, the pedestal 104 can be "pre-cooled" while maintaining the die temperature at a set temperature with the heatlet 106 performing the control of the die temperature.

As seen in FIG. 3A and FIG. 3B, in order to maintain the high temperature on the DUT 114 until the thermal testing requires the set temperature to change, the typical device may need to maintain the entire pedestal 204 at the high temperature. At a set temperature change, a cooling element 302 can be thermally coupled to the pedestal 204 to begin ramping down the temperature. On the other hand, as only the heatlet 106 may be required to heat the DUT 114 in the present embodiments, the pedestal 104 may be "pre-cooled" while maintaining the die temperature at the set temperature.

Figure 4A:
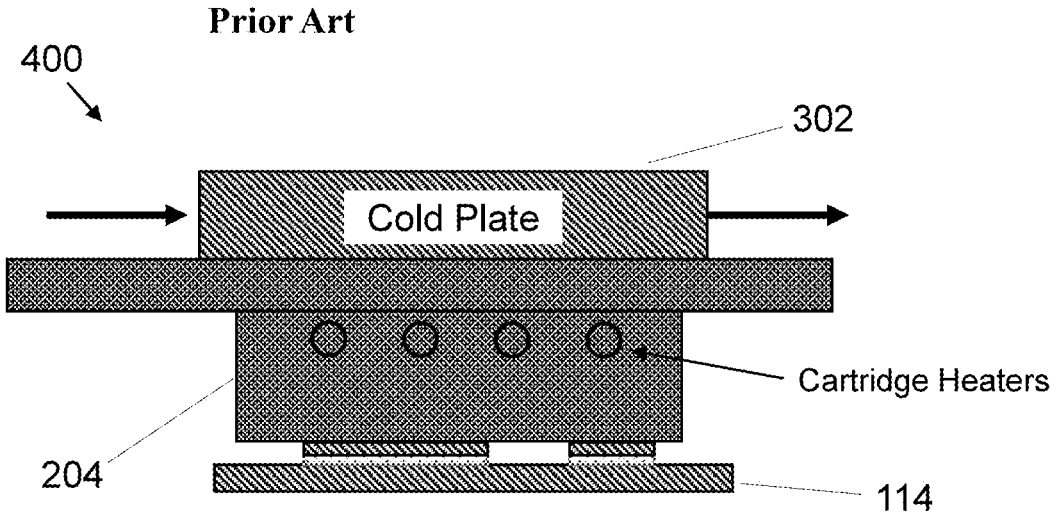
FIG. 4A is a schematic representation illustrating the typical device during a die temperature ramp down process.

FIG. 4A is a schematic representation 400 illustrating the typical device during a die temperature ramp down process. As shown in FIG. 4A, the pedestal 204 may need to be cooled entirely in order to cool the DUT 114.

Figure 4B:
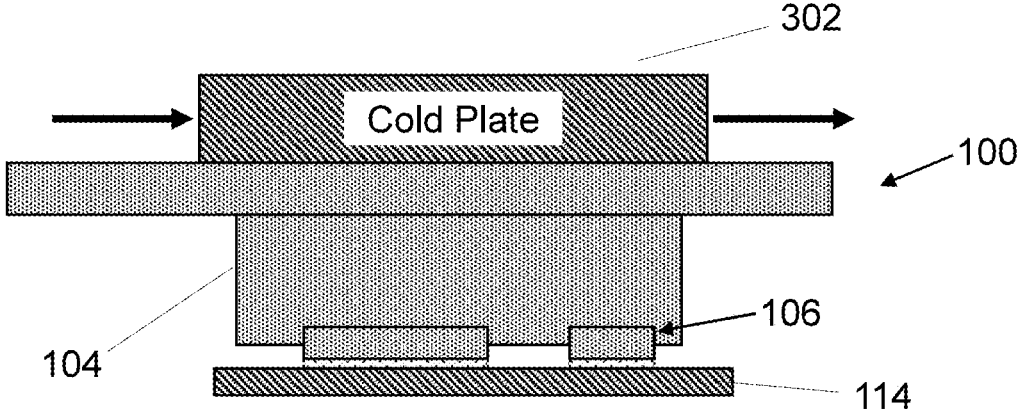
FIG. 4B is a schematic representation illustrating the device of FIG. 1 during the die temperature ramp down process.

FIG. 4B is a schematic representation 400 illustrating the device 100 of FIG. 1 during the die temperature ramp down process. As shown in FIG. 4B, the heatlet 106 may be the mass that needs to be cooled other than the DUT 114.

In other words, for the typical device, the cooling element 302 may be required to provide sufficient cooling to cool down the entire pedestal 204 in order to reduce the temperature of the DUT 114. The present embodiments, on the other hand, may only need to connect the cooling element 302 to the pedestal 104 for a duration long enough to conduct the cooling from the cooling element 302 through the cool pedestal 104 to cool down the heatlet 106 as the heatlet 106 and the DUT 114 may be the only heated mass that needs to be cooled. This beneficially enables reduced time to reset the temperature of the DUT 114, leading to a reduction in an overall thermal testing time of the DUT 114. This time savings is multiplied throughout the thermal testing as each run of the thermal testing utilizing the heatlet 106 in accordance with the present embodiments will require less time.

Figure 5:
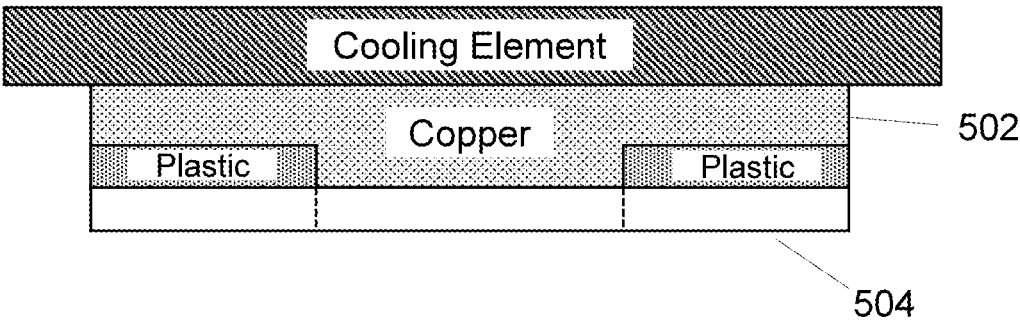
FIG. 5 is a schematic representation of a device for thermal testing the die, wherein the device comprises a pedestal comprising more than one material, according to another example embodiment.

FIG. 5 is a schematic representation of a device 500 for thermal testing the die, wherein the device 500 comprises a pedestal 502 comprising more than one material, according to another example embodiment. In accordance with the present embodiments, the pedestal 502 may comprise copper. The pedestal 502 may further comprise plastic. As shown in FIG. 5, the heatlet 504 may be attached to the first end of the pedestal 502. The first end of the pedestal 502 may comprise different materials, such as copper and plastic, disposed at different regions or zones based on the temperature profiles and testing requirements of the DUT. Beneficially, the device 500 increases energy efficiency as materials with poorer thermal conductivity can be disposed at the regions or zones where less cooling is required at the corresponding regions or zones of the heatlet 504 and DUT.

In accordance with the present embodiments, the device 100, 500 may further comprise a plurality of clamps (see, for example, 107 in FIG. 1A) disposed on the pedestal 104, 502 for attaching the heatlet 106, 504 to the first end of the pedestal 104, 502. The device 100, 500 may further comprise one or more openings in the heatlet 106, 504 configured in operation to permit injection of a first liquid layer between the face of the heatlet 106, 504 and the one or more dies 102 to form an even, steady thermally conductive temporary bond therebetween. The device 100, 500 may further comprise a second liquid layer and/or a graphite plate (see, for example, 105 in FIG. 1A and FIG. 1B) disposed between the heatlet 106, 504 and the pedestal 104, 502 to form a stable, compressible thermally conductive attachment between the heatlet 106, 504 and the pedestal 104, 502.

Figure 6:
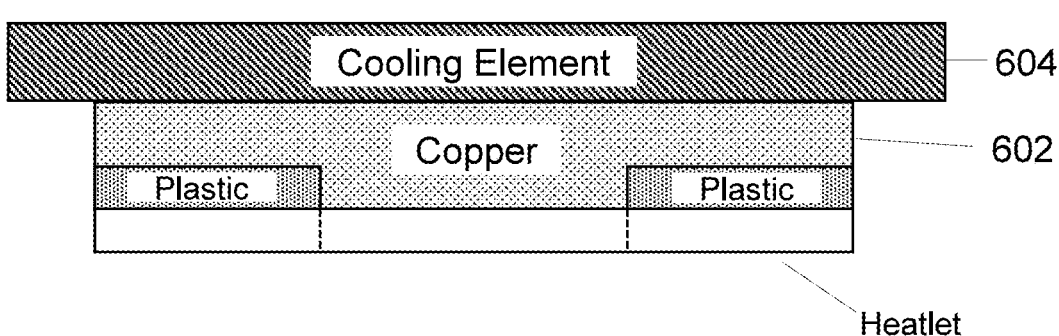
FIG. 6 is a schematic representation of a device for thermal testing the die, wherein the device comprises a pedestal integrated with a cooling element, according to another example embodiment.

FIG. 6 is a schematic representation of a device 600 for thermal testing the die, wherein the device 600 comprises a pedestal 602 integrated with a cooling element 604, according to another example embodiment. In accordance with the present embodiments, the pedestal may comprise a cooling element. As shown in FIG. 6, the pedestal 602 and the cooling element 604 may be manufactured as a single piece. Beneficially, the device 600 reduces assembly time needed to assemble the pedestal 602 and the cooling element 604.

Figure 7:
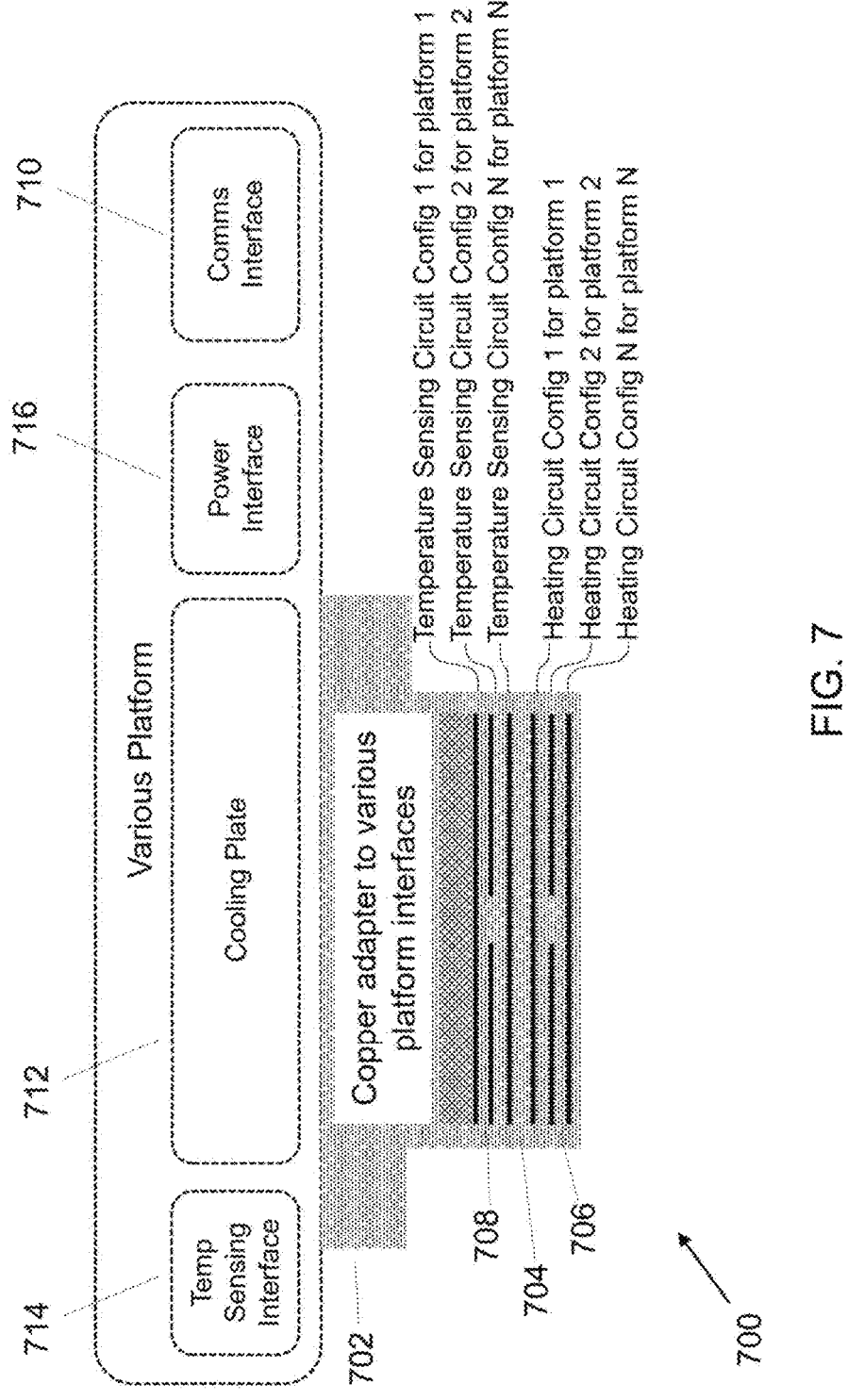
FIG. 7 is a schematic representation of a thermal tester for testing one or more exposed or covered dies of an integrated circuit on a testing platform, according to an example embodiment.

As mentioned above, the heatlet can be designed as a multi-layer heater. In other words, the heatlet can be designed to have multiple layers of heating circuitry and multiple layers of temperature sensing circuitry. The same heatlet can be designed to be able to be used on various platforms with different interfaces and different configurations for power and temperature sensing. FIG. 7 is a schematic representation of a thermal tester 700 for testing one or more exposed or covered dies of an integrated circuit on a testing platform, according to an example embodiment. The thermal tester 700 comprises an adapter 702 configured to match a geometry of the testing platform. The thermal tester 700 also comprises a heatlet 704 attached to a first end of the adapter 702. The heatlet 704 comprises a face comprising one or more plates. The one or more plates are configured to match a geometry of the one or more dies. The heatlet 704 also comprises heating circuitry 706 configured in operation to heat the one or more plates of the face. Further, the heatlet 704 comprises sensing circuitry 708 configured in operation to sense a temperature of the heatlet 704. The one or more covered dies may be lidded dies of the integrated circuit.

In accordance with the present embodiments, the heatlet 704 may comprise a ceramic heatlet. The heating circuitry 706 may comprise one or more layers of heating circuits (see 110a in FIG. 1A) and the sensing circuitry 708 may comprise one or more layers of sensing circuits (see 112a in FIG. 1A). The thermal tester 700 may further comprise a communication interface 710 configured in operation to receive a command for thermal testing the one or more dies. The communication interface 710 may be connected to the adapter 702. The thermal tester 700 may further comprise a control interface configured in operation to provide a feedback from the sensing circuitry 708.

As shown in FIG. 7, when the heatlet 704 is to be used on a specific platform, specific circuits such as temperature sensing interface circuitry corresponding to a temperature sensing interface 714, power interface circuitry corresponding to a power interface 716 and communication interface circuitry corresponding to the communication interface 710 can be connected to match a power configuration and temperature sensing configuration of the platform. In addition, when the heatlet 704 is to be used on the specific platform, the adapter 702 (i.e., the pedestal) can be designed to match an interface of a cooling element 712 such as a cooling plate. Within a same horizontal layer of the heating circuitry 706 and the sensing circuitry 708, there can be multiple heating circuits and multiple temperature sensing circuits working independently. The heating circuits may be of different configurations and be designed for different power levels and different voltages. The temperature sensing circuits may also be of different configurations and be designed with different resistance levels.

In accordance with the present embodiments, at least one of the one or more layers of heating circuits 110a may comprise a plurality of individually controllable heating zones 110b. One or more of the plurality of individually controllable heating zones 110b may be configured to control a temperature in a corresponding one of the one or more plates of the face. The thermal tester 700 may further comprise one or more grooves 110c disposed between the plurality of individually controllable heating zones 110b. At least one of the one or more layers of sensing circuits 112a may comprise a plurality of temperature sensors 112b, each of the plurality of temperature sensors 112b corresponding to one of the plurality of individually controllable heating zones 110b. The one or more layers of heating circuits 110a and the plurality of individually controllable heating zones 110b of the at least one of the one or more layers of heating circuits 110a may be coupled to the communication interface. The communication interface may be configured in operation to activate at least a portion of the one or more layers of heating circuits 110a and/or the plurality of individually controllable heating zones 110b of the at least one of the one or more layers of heating circuits 110a in response to the communication interface receiving the command for thermal testing the one or more dies.

The one or more layers of sensing circuits 112a and the plurality of temperature sensors 112b of the at least one of the one or more layers of sensing circuits 112a may be coupled to the control interface. In operation, at least a portion of the one or more layers of sensing circuits 112a and/or the plurality of temperature sensors 112b of the at least one of the one or more layers of sensing circuits 112a corresponding to the at least a portion of the one or more layers of heating circuits 110a and/or the plurality of individually controllable heating zones 110b of the at least one of the one or more layers of heating circuits 110a activated in response to the command for thermal testing in operation can provide sensing signals to the control interface to provide the feedback from the sensing circuitry.

The communication interface may be coupled to the power interface which controls the heating zones 110b to activate at least a portion of the heating zones 110b in response to the communication interface receiving a command for thermal testing the one or more dies. A sensed temperature feedback may be provided to the control interface for communicating sensed temperature information or acting on the sensed temperature feedback.

Figure 8:
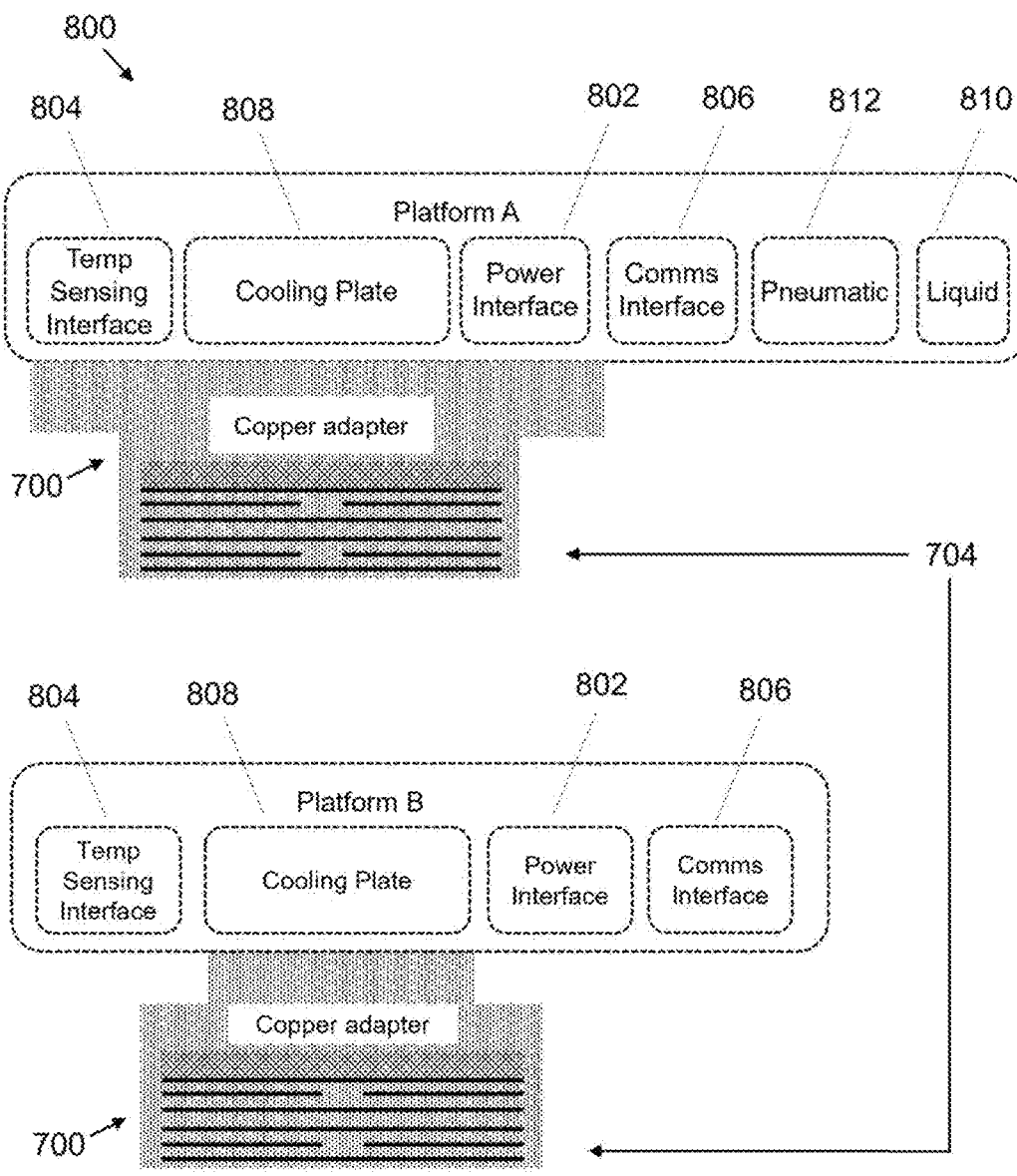
FIG. 8 is a schematic representation of two thermal testers of FIG. 7, wherein each thermal tester comprises a different adapter with a same heatlet.

FIG. 8 is a schematic representation 800 of two thermal testers 700 of FIG. 7, wherein each thermal tester 700 comprises a different adapter with a same heatlet 704. As shown in FIG. 8, the same heatlet 704 can be used on different adapters (e.g., adapters of different configurations, shapes, specifications, etc.), and with different platforms (e.g., Platform A and Platform B as depicted in FIG. 8).

As depicted in FIG. 8, Platform B includes a power interface 802 connected to multiple individually controllable heating zones (see 110b in FIG. 1A), a temperature sensing interface 804 connected to temperature sensors (see 112b in FIG. 1A) corresponding to the heating zones, a communication interface 806 connected to the adapter, and a cooling plate 808. Platform A includes all of the elements of Platform B and additionally includes a liquid 810 which can be supplied to the adapter for pre-cooling and a pneumatic connection 812 which can push the liquid through its connection to the adapter.

In accordance with the present embodiments, the adapter 702 may comprise a pedestal comprising copper. The pedestal may further comprise plastic.

The thermal tester 700 may further comprise a plurality of clamps (see 107 in FIG. 1A) disposed on the adapter 702 for attaching the heatlet 704 to the first end of the adapter 702. The thermal tester 700 may further comprise one or more openings in the heatlet 704 configured in operation to permit injection of a first liquid layer between the face of the heatlet 704 and the one or more dies. The thermal tester 700 may further comprise a second liquid layer and/or a graphite plate disposed between the heatlet 704 and the adapter 702.

The thermal tester 700 may further comprise a cooling element disposed at a second end of the adapter 702. The cooling element may comprise at least one of a cooling plate, a third liquid layer and an air layer. Further, the adapter 702 may comprise a cooling element integrated with the adapter 702. The thermal tester 700 may further comprise a power interface coupled to the heating circuitry and configured in operation to receive power from the testing platform.

It will be appreciated by a person skilled in the art that numerous variations and/or modifications may be made to the present invention as shown in the specific embodiments without departing from the spirit or scope of the invention as broadly described. For example, parameters such as a number of layers of heating circuits and sensing circuits may vary depending on the application for optimizing performance. The present embodiments are, therefore, to be considered in all respects to be illustrative and not restrictive.

What is claimed is:

1. A device for thermal testing one or more exposed or covered dies of an integrated circuit, comprising:
a pedestal;
a heatlet attached to a first end of the pedestal, the heatlet comprising:
a face comprising one or more plates, wherein the one or more plates are configured to match a geometry of the one or more dies,
heating circuitry comprising two or more layers of heating circuits and configured in operation to heat the one or more plates of the face, and
sensing circuitry configured in operation to sense a temperature of the heatlet; and
a plurality of clamps disposed on the pedestal for attaching the heatlet to the first end of the pedestal.

2. The device of claim 1, wherein the heatlet comprises a ceramic heatlet.

3. The device of claim 1, further comprising a graphite plate disposed between the heatlet and the pedestal.

4. The device of claim 1, wherein the sensing circuitry comprises two or more layers of sensing circuits.

5. The device of claim 4, wherein at least one of the two or more layers of heating circuits comprises a plurality of individually controllable heating zones, and wherein each of the plurality of individually controllable heating zones is configured to control a temperature in a corresponding one of the one or more plates of the face.

6. The device of claim 5, further comprising one or more grooves disposed between the plurality of individually controllable heating zones.

7. The device of claim 5, wherein at least one of the one or more layers of sensing circuits comprises a plurality of temperature sensors, each of the plurality of temperature sensors associated with one of the plurality of individually controllable heating zones.

8. The device of claim 1, wherein the pedestal comprises copper.

9. The device of claim 8, wherein the pedestal further comprises plastic.

10. The device of claim 1, wherein the pedestal comprises a cooling element.

11. A thermal tester for testing one or more exposed or covered dies of an integrated circuit on a testing platform, comprising:
an adapter configured to match a geometry of the testing platform;
a heatlet attached to a first end of the adapter, the heatlet comprising:
a face comprising one or more plates, wherein the one or more plates are configured to match a geometry of the one or more dies,
heating circuitry comprising two or more layers of heating circuits and configured in operation to heat the one or more plates of the face, and
sensing circuitry configured in operation to sense a temperature of the heatlet;
a communication interface configured in operation to receive a command for thermal testing the one or more dies; and
a plurality of clamps disposed on the adapter for attaching the heatlet to the first end of the adapter.

12. The thermal tester of claim 11, wherein the heatlet comprises a ceramic heatlet.

13. The thermal tester of claim 11, further comprising a control interface configured in operation to provide a feedback from the sensing circuitry, and wherein the sensing circuitry comprises two or more layers of sensing circuits.

14. The thermal tester of claim 13, wherein at least one of the two or more layers of heating circuits comprises a plurality of individually controllable heating zones, and wherein each of the plurality of individually controllable heating zones is configured to control a temperature in a corresponding one of the one or more plates of the face.

15. The thermal tester of claim 14, further comprising one or more grooves disposed between the plurality of individually controllable heating zones.

16. The thermal tester of claim 14, wherein at least one of the two or more layers of sensing circuits comprises a plurality of temperature sensors, each of the plurality of temperature sensors associated with one of the plurality of individually controllable heating zones.

17. The thermal tester of claim 16, wherein the two or more layers of heating circuits and the plurality of individually controllable heating zones of the at least one of the two or more layers of heating circuits are coupled to the communication interface, and wherein the communication interface is configured in operation to activate at least a portion of the two or more layers of heating circuits and/or at least a portion of the plurality of individually controllable heating zones of the at least one of the two or more layers of heating circuits in response to the communication interface receiving the command for thermal testing the one or more dies.

18. The thermal tester of claim 17, wherein the one or more layers of sensing circuits and the plurality of temperature sensors of the at least one of the one or more layers of sensing circuits are coupled to the control interface, and wherein, in operation, at least a portion of the one or more layers of sensing circuits and/or the plurality of temperature sensors of the at least one of the one or more layers of sensing circuits corresponding to the at least a portion of the two or more layers of heating circuits and/or the at least a portion of the plurality of individually controllable heating zones of the at least one of the two or more layers of heating circuits are activated in response to the command for thermal testing during operation to provide sensing signals to the control interface to provide the feedback from the sensing circuitry.

19. The thermal tester of claim 11, wherein the adapter comprises a pedestal comprising copper.

20. The thermal tester of claim 19, wherein the pedestal further comprises plastic.

21. The thermal tester of claim 11, wherein the adapter comprises a cooling element.

22. The thermal tester of claim 11, further comprising a power interface coupled to the heating circuitry and configured in operation to receive power from the testing platform.

23. The thermal tester of claim 11, further comprising a graphite plate disposed between the heatlet and the pedestal.

\* \* \* \* \*